US009239897B2

(12) United States Patent
Chebiyam et al.

(10) Patent No.: US 9,239,897 B2
(45) Date of Patent: Jan. 19, 2016

(54) HIERARCHICAL TESTING ARCHITECTURE USING CORE CIRCUIT WITH PSEUDO-INTERFACES

(71) Applicant: Synopsys, Inc., Mountain View, CA (US)

(72) Inventors: Subramanian B. Chebiyam, Sunnyvale, CA (US); Santosh Kulkarni, Bangalore (IN); Anshuman Chandra, Sunnyvale, CA (US); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/243,602

(22) Filed: Apr. 2, 2014

(65) Prior Publication Data
US 2014/0304672 A1 Oct. 9, 2014

Related U.S. Application Data

(60) Provisional application No. 61/808,155, filed on Apr. 3, 2013, provisional application No. 61/856,474, filed on Jul. 19, 2013.

(51) Int. Cl.
*G06F 17/50* (2006.01)
*G01R 31/3185* (2006.01)
(52) U.S. Cl.
CPC .... *G06F 17/5045* (2013.01); *G01R 31/318547* (2013.01)
(58) Field of Classification Search
None
See application file for complete search history.

(56) References Cited

U.S. PATENT DOCUMENTS

| | | | |
|---|---|---|---|
| 5,475,695 A | 12/1995 | Caywood et al. | |
| 6,185,707 B1 | 2/2001 | Smith et al. | |
| 6,288,955 B1 | 9/2001 | Shibano et al. | |
| 6,418,545 B1 | 7/2002 | Adusumilli | |
| 6,557,129 B1 | 4/2003 | Rajski et al. | |
| 6,618,830 B1 | 9/2003 | Balachandran et al. | |
| 7,139,948 B2 | 11/2006 | Rearick et al. | |
| 7,370,254 B2 | 5/2008 | Rajski et al. | |
| 7,859,285 B2 | 12/2010 | Sheu et al. | |
| 8,261,142 B2 | 9/2012 | Guo et al. | |
| 8,694,951 B1 * | 4/2014 | Prasanna et al. | 716/136 |
| 2005/0055617 A1 | 3/2005 | Wang et al. | |
| 2007/0061637 A1 | 3/2007 | Ward et al. | |
| 2007/0143651 A1 | 6/2007 | Kiryu | |

(Continued)

OTHER PUBLICATIONS

Chandra et al., "Scalable Adaptive Scan (SAS)," 2009 EDAA, 6 pages.*

(Continued)

*Primary Examiner* — Leigh Garbowski
(74) *Attorney, Agent, or Firm* — Fenwick & West LLP (57) ABSTRACT

A core circuit that can be connected in a hierarchical manner, and configured to test a multiple circuits is disclosed. The core circuit includes at least one real input for receiving scan-in data for controlling operation of the core circuit. The core circuit further includes an input register coupled to the at least one real input and configured to store data. The core circuit further includes at least one scan chain coupled a subset if registers of the register chain and configured to generate scan-out data representing the presence of faults in an circuit. Furthermore, the core circuit includes at least one control pseudo-output coupled to the input register and configured to route at least a subset of the data to another register chain in the core circuit or to another core circuit.

19 Claims, 10 Drawing Sheets

(56) References Cited

U.S. PATENT DOCUMENTS

| | | |
|---|---|---|
| 2007/0179731 A1 | 8/2007 | Suri et al. |
| 2007/0234169 A1 | 10/2007 | Rajski et al. |
| 2008/0294955 A1 | 11/2008 | Kapur et al. |
| 2008/0301510 A1 | 12/2008 | Kapur et al. |
| 2010/0017760 A1 | 1/2010 | Kapur et al. |
| 2010/0192030 A1 | 7/2010 | Kapur et al. |
| 2011/0258498 A1 | 10/2011 | Chandra et al. |

OTHER PUBLICATIONS

Chakrabarty et al., IEEE Trans on CAD of ICs & Systems, vol. 24, No. 3, Mar. 2005, pp. 435-448.*

Dutta et al., "Using Limited Dependence Sequential Expansion for Decompressing Test Vectors," 2006 IEEE Int'l Test Conference, Paper 23.1, pp. 1-12.*

Devanathan et al., "Reducing SoC Test Time and Test Power in Hierarchical Scan Test : Scan Architecture and Algorithms," 2007 IEEE 20$^{th}$ Int'l Conference on VLSI Design, 6 pages.*

Kapur et al., "Manufacturing Test of SoCs," 2002 IEEE Proc. of the 11$^{th}$ Asian Test Symposium, 3 pages.*

Iyengar et al., "A Unified SOC Test Approach Based on Test Data Compression and TAM Design," 2003 IEEE Proc. of the 18$^{th}$ IEEE Tin'l Symposium on Defect and Fault Tolerance in VLSI Systems, 8 pages.*

Iyengar et al., "Test Access Mechanism Optimization, Test Scheduling, and Tester Data Volume Reduction for System-on-Chip," IEEE Trans. on Computers, vol. 52, No. 12, Dec. 2003, pp. 1619-1632.*

Gonciari et al., "Compression considerations in test access mechanism design," IEE Proc.-Comput. Digit. Tech, vol. 152, No. 1, Jan. 2005, pp. 89-96.*

Larsson et al., "Test-Architecture Optimization and Test Scheduling for SOCs with Core-Level Expansion of Compressed Test Patterns," 2008 EDAA, pp. 188-193.*

Nadeau-Dostie et al., "Improved Core Isolation and Access for Hierarchical Embedded Test," Jan./Feb. 2009 IEEE Design & Test of Computers, pp. 18-25.*

Remmers et al., "Hierarchical DFT Methodology—A Case Study," 2004 IEEE ITC Int'l Test Conference, Paper 30.2, pp. 847-856.*

Sinanoglu et al., "A Non-Intrusive Isolation Approach for Soft Cores," 2007 EDAA, pp. 27-32.*

Srinavasan et al., "Hierachical DFT with Combinational Scan Compression, Partition Chain and RPCT," 2010 IEEE Annual Symposium on VLSI, pp. 52-57.*

Su et al., "Multiple Path Sensitization for Hierachical Circuit Testing," IEEE 1990 Int'l Test Conference, Paper 6.2, pp. 152-161.*

Su et al., "Computer-Aided Design of Pseudoexhaustive BIST for Semiregular Circuits," 1990 IEEE Int'l Test Conference, Paper 30.4, pp. 680-689.*

Wohl et al., "Fully X-tolerant Combinational Scan Compression," 2007 IEEE Int'l Test Conference, Paper 6.1, pp. 1-10.*

Wohl et al., "Minimizing the Impact of Scan Compression," 2007 IEEE 25$^{th}$ IEEE VLSI Test Symposium, 8 pages.*

Xu et al., "Modular and Rapid Testing of SOCs With Unwrapped Logic Blocks," IEEE Trans. on VLSI Systems, vol. 13, No. 11, Nov. 2005, pp. 1275-1285.*

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

Chandra, A. et al., "Scalable Adaptive Scan (SAS)," EDAA, 2009, 6 pages.

Devanathan, V.R. et al., "Reducing SoC Test Time and Test Power in Hierarchical Scan Test: Scan Architecture and Algorithms," IEEE 20th Int'l Conference on VLSI Design, VLSID'07, 2007, 6 pages.

Dutta et al., "Using Limited Dependence Sequential Expansion for Decompressing Test Vectors," IEEE Int'l Test Conference, 2006, Paper 23.1, pp. 1-9.

Gonciari, P.T. et al., "Compression Considerations in Test Access Mechanism Design," IEE Proc.-Comput. Digit. Tech, Jan. 2005, pp. 89-96, vol. 152, No. 1.

Iyengar, V. et al., "A Unified SOC Test Approach Based on Test Data Compression and TAM Design," Proceedings of the 18$^{th}$ IEEE International Symposium on Defect and Fault Tolerance in VLSI Systems, (DFT'03), IEEE, 2003, 8 pages.

Iyengar, V. et al., "Test Access Mechanism Optimization, Test Scheduling, and Tester Data Volume Reduction for System-on-Chip," IEEE Transactions on Computers, Dec. 2003, pp. 1619-1632, vol. 52, No. 12.

Kapur, R. et al., "Manufacturing Test of SoCs," Proceedings of the 11th Asian Test Symposium, (ATS'02), IEEE, 2002, 3 pages.

Larsson, A. et al., "Test-Architecture Optimization and Test Scheduling for SOCs with Core-Level Expansion of Compressed Test Patterns," EDAA, 2008, pp. 188-193.

Nadeau-Dostie, B. et al., "Improved Core Isolation and Access for Hierarchical Embedded Test," IEEE Design & Test of Computers, Jan./Feb. 2009, pp. 18-25.

Remmers, J. et al.,"Hierarchical DFT Methodology—A Case Study," ITC International Test Conference, IEEE, 2004 Paper 30.2, pp. 847-856.

Sinanoglu, O. et al., "A Non-Intrusive Isolation Approach for Soft Cores," EDAA, 2007, pp. 27-32.

Srinavasan, P. et al., "Hierarchical DFT with Combinational Scan Compression, Partition Chain and RPCT," 2010 IEEE Annual Symposium on VLSI, IEEE, 2010, pp. 52-57.

Su et al., "Multiple Path Sensitization for Hierarchical Circuit Testing," IEEE 1990 Int'l Test Conference, Paper 6.2, pp. 152-161.

Su et al., "Computer-Aided Design of Pseudoexhaustive BIST for Semiregular Circuits," 1990 IEEE International Test Conference, 1990, Paper 30.4, pp. 680-689.

Wohl, P. et al., "Fully X-tolerant Combinational Scan Compression," 2007 IEEE International Test Conference, IEEE, 2007, Paper 6.1, pp. 1-10.

Wohl, P. et al., "Minimizing the Impact of Scan Compression," 25th IEEE VLSI Test Symposium (VTS'07), IEEE, 2007, 8 pages.

Xu, Q. et al., "Modular and Rapid Testing of SOCs With Unwrapped Logic Blocks," IEEE Transactions on Very Large Scale Integration (VLSI) Systems, Nov. 2005, pp. 1275-1285, vol. 13, No. 11.

* cited by examiner

FIG. 8

HIERARCHICAL TESTING ARCHITECTURE USING CORE CIRCUIT WITH PSEUDO-INTERFACES

CROSS REFERENCE TO RELATED APPLICATIONS

This application claims the benefit of U.S. Provisional Application No. 61/808,155, filed Apr. 3, 2013, and U.S. Provisional Application No. 61/856,474, filed Jul. 19, 2013, which are incorporated by reference herein in their entirety.

BACKGROUND

1. Field of the Disclosure

The present disclosure relates to hierarchical architecture of testing circuits for testing of an integrated circuit using automated test equipment (ATE).

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop. Outputs of multiple scan flops may be compressed into a bit stream to reduce data bandwidth and pins associated with the testing of IC.

As the number of circuits integrated on a System-on-a-Chip (SOC) increases, building a hierarchical test infrastructure is becoming more important. An efficient hierarchical design-for-test (DFT) implementation not only enables quality testing of the SOC but also provides a tool that can aid debugging the problems in the integrated circuit during manufacturing. With the evolution of compression technologies in the recent years, more and more people are migrating away from scan methodology for manufacturing test to save test cost and test time.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a test core circuit for inclusion in a multi-core test circuit that includes a plurality of test core circuits that are hierarchically arranged. Test core circuit includes pseudo-inputs and pseudo-outputs that can be connected outside the test core circuit to implement signal paths for implementing the multi-core test circuit. By connecting the pseudo-inputs and pseudo-outputs in different ways, various types of multi-core test circuit can be implemented.

A pseudo-input described herein refers to an input port of a core circuit that is accessible only from within the test circuit to receive data. The pseudo-input is inaccessible from outside the test circuit. Pseudo-inputs of a core circuit may be connected to other nets located inside the test core (e.g., outputs of other test core circuits, test logic located inside the test circuit, etc.), but may not be directly connected to nets that located outside the test core.

A pseudo-output described herein refers to an output port of a test core circuit that is accessible only from within the test circuit to transmit data. The pseudo-output is inaccessible from outside the test circuit.

Figure 1:
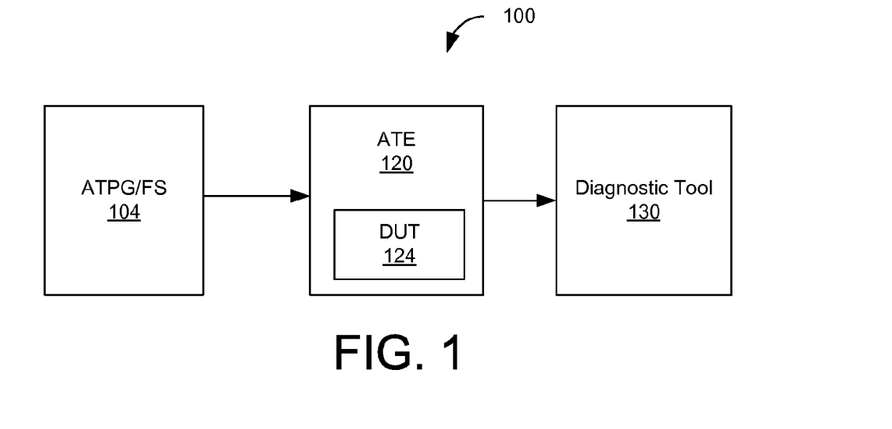
FIG. 1 is a block diagram illustrating a system for testing and diagnosing a device under test (DUT), according to one embodiment.

FIG. 1 is a block diagram illustrating a system 100 for testing and diagnosing a device under test (DUT) 124, according to one embodiment. DUT 124 is an integrated circuit (IC) that is being tested for faults in its fabrication process. The system 100 may include, among other components, an automatic test pattern generator/fault simulator (ATPG/FS) 104, an automatic test equipment (ATE) 120, and a diagnostic tool 130. One or more of these components may be combined into a single product or device.

ATPG/FS 104 generates test patterns provided to ATE 120 and scan-out values corresponding to the test patterns for detecting faults in DUT 124. Scan-out values represent the expected output from a faultless integrated circuit when provided with the test patterns. A test pattern includes scan-in data and control data for controlling test operation in DUT 124, as described below in detail with reference to FIG. 3A. Scan-in data changes for each shift of bit, and hence, the scan-in data may be referred to as a dynamic data. The control data stored in registers 329 remains constant throughout a test pattern, and hence, this control pattern may be referred to a static data. ATE 120 provides the test patterns as scan-in data and control data to DUT 124, and captures output from DUT 124. The captured output from DUT 124 is compared with scan-out values. ATE 120 then generates fault data indicating the difference in the scan-out values and the output from DUT 124.

ATE 120 then sends fault data to diagnostic tool 130 to localize and diagnose the cause of faults in DUT 124. If a fault is detected based on an unexpected output of DUT 124, diagnostic tool 130 may request ATPG/FS 104 to generate further test patterns to localize or specify a scan flop associated with the unexpected value.

Figure 2:
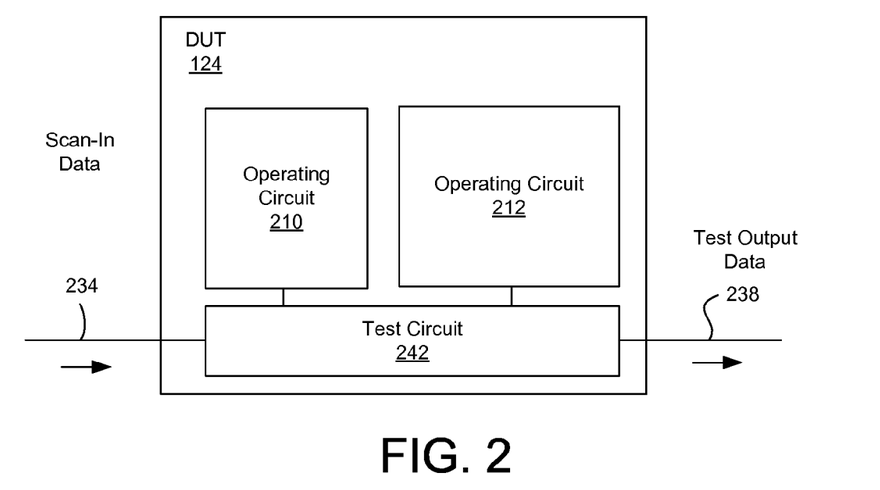
FIG. 2 is a block diagram of a DUT including a test circuit, according to one embodiment.

FIG. 2 is a block diagram of DUT 124 including a test circuit 242 for performing testing of sub-circuits in DUT 124, according to one embodiment. DUT 124 may include, among other components, one or more sub-circuits 210, 212 and test circuit 242. DUT 124 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 104 and sending test output data 238 (i.e., an output in response to the test patterns) to diagnostic tool 130.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2 as testing both sub-circuits 210, 212, more than one test circuit may be provided in DUT to separately test a certain sub-circuit. In embodiments with multiple test circuits, each test circuit may be connected to the same or different pins.

Figure 3A:
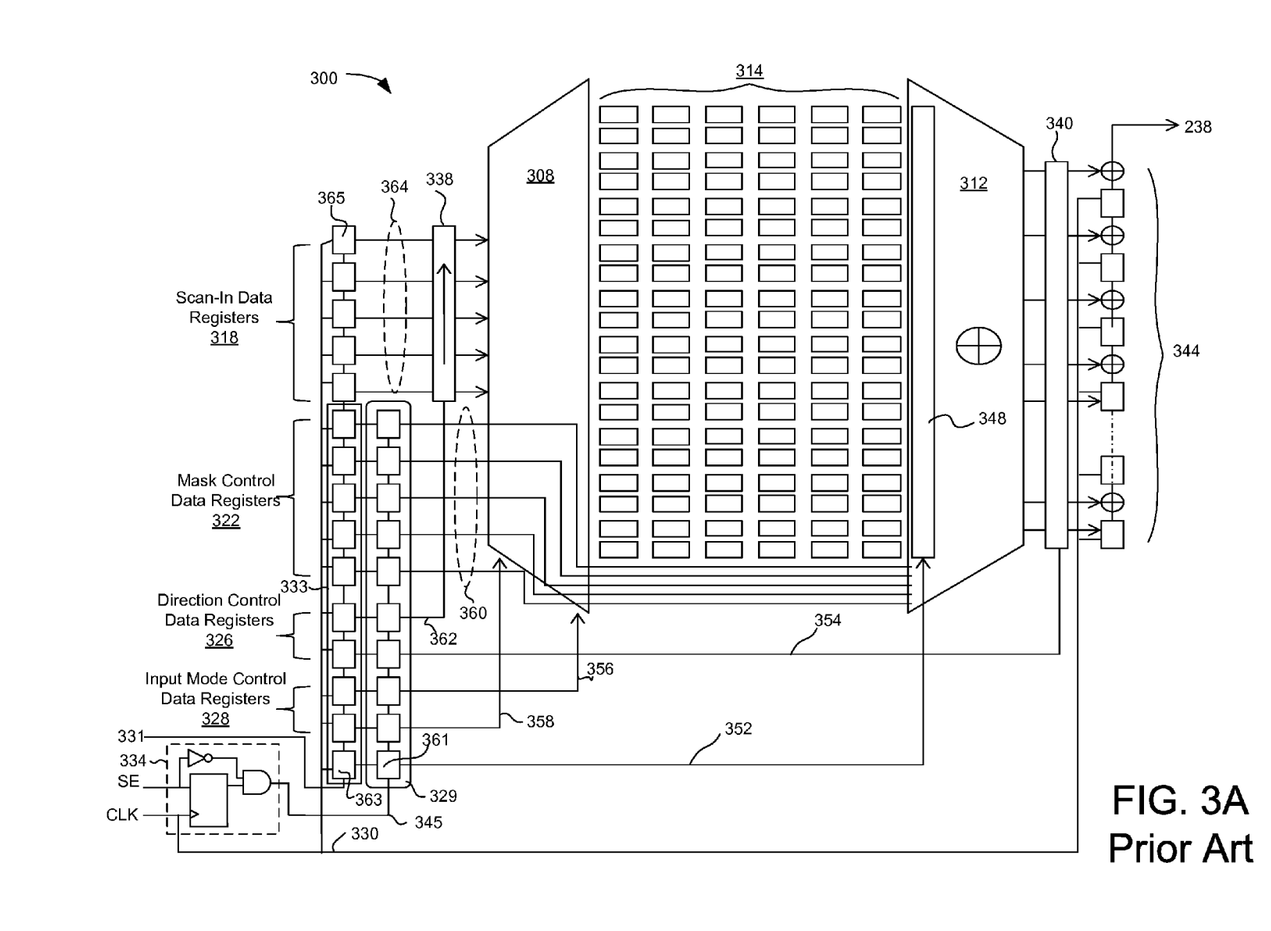
FIG. 3A is a circuit diagram of a test circuit in the DUT, according to one embodiment.

FIG. 3A is a circuit diagram of test circuit 242 in the DUT 124, according to one embodiment. Test circuit 242 may include one or more test core circuits 300. Each test core circuit 300 may include, among other components, a decompressor 308, a compressor 312, chains of scan flops 314, input registers 318, 322, 326, 328, 329, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329. Such architecture of test circuit where the test pattern includes scan-in data and control data is referred to herein as SAS.

Control logic 334 synchronizes the operation of components in test circuit 242 by providing a clock signal via line 345. When a clock signal is input to current control registers 329, the bit values in control registers 333 are loaded onto current control registers 329. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom of the register chain up to a scan-in data registers 365 at the top of the register chain as bits for the current test pattern is received via line 331. Although a single line 331 is illustrated in FIG. 3A as receiving the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 via line 345. Current registers 329 stores control values until the next capture clock so that decompressor 308 and compressor 312 can be controlled without undergoing change with every shift of scan-in data. That is, registers 333 enable control values to be shifted to register 329 only once per pattern.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
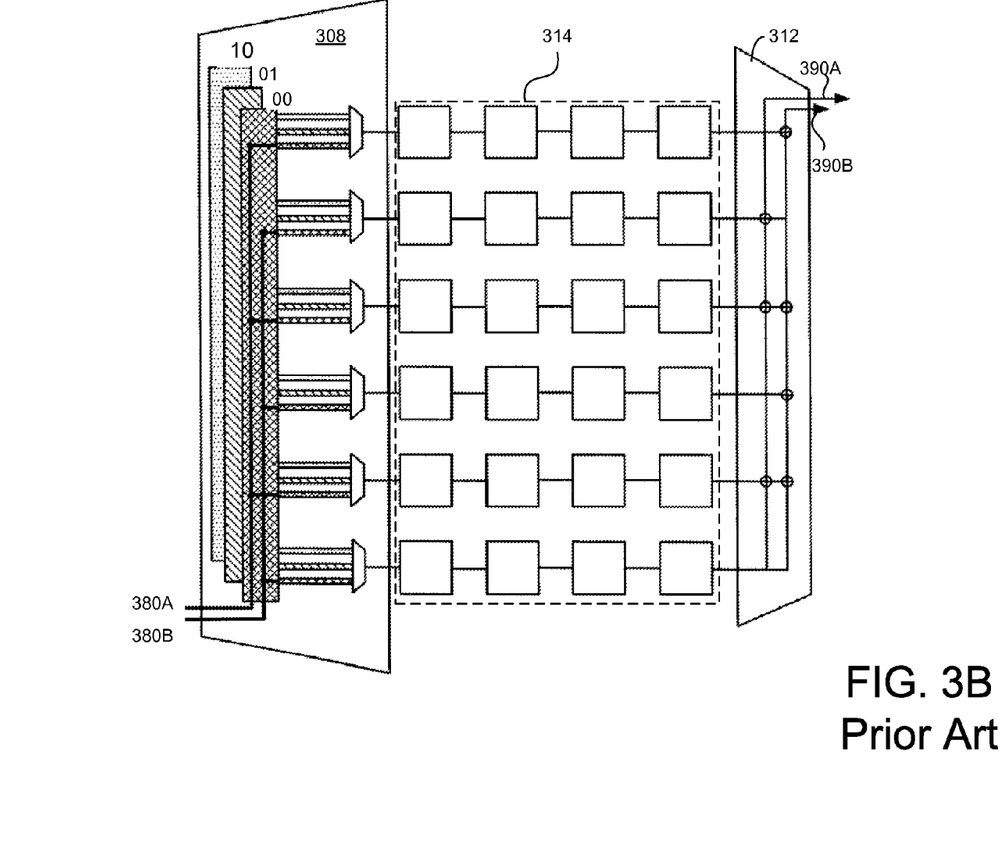
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask control data registers 322 of the current control registers 329 define the masking of certain scan chains. The bit values of mask control data registers 322 are provided to compressor 312 via lines 360. In response to receiving mask enable signal via line 352 and active signals in lines 360, a mask block 348 in compressor 312 masks certain scan chains as defined by the bit values of mask control data registers 322. The mask enable bit value stored in register 361 is sent to mask block 348 to enable or disable masking operation via line 352. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of current control registers 329 store bit values for a current test pattern and other current control registers 329 store bit values for a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are for the current test pattern. Conversely, bit value in direction control data registers 326 of current control registers 329 controlling output direction block 340 for the current test pattern, bit values in mask control data registers 322 of current control registers 329, a bit value in mask enable register 361 of current control registers 329 are for the previous test pattern. This mixture of control values at 329 is due to the fact that, while one pattern is being loaded through line 331, the previous pattern is being unloaded though line 239.

FIG. 3B is a conceptual diagram illustrating the operation of decompressor 308 and compressor 312 in a test circuit, according to one embodiment. Decompressor 308 may be selected to operate in one of the selected modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 120 and diagnostic tool 130 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

For example, the compressor of FIG. 3B compresses the output of the test circuit into two output values 390A and 390B. Output 390A of FIG. 3B is the result of the XOR operation between the output of the first scan chain, the third scan chain, the fourth scan chain, the fifth scan chain and the sixth scan chain. Hence, an unexpected value in output 390A may originate from faults associated with any one or more of the first scan chain, the third scan chain, the fourth scan chain, the fifth scan chain and the sixth scan chain. Similarly, output 390B of FIG. 3B is the result of the XOR operation between the output of the second scan chain, the third scan chain, the fifth scan chain and the sixth scan chain. Hence, an unexpected value in output 390B may originate from faults associated with any one or more of the second scan chain, the third scan chain, the fifth scan chain and the sixth scan chain. In order to identify the exact scan chain and/or scan flop causing the unexpected values in the outputs, additional test patterns or analysis may be needed.

In some circuits, it is beneficial to use a test circuit 242 with multiple test core circuits 300 connected in a hierarchical manner. Connecting multiple test core circuits 300 in a hierarchical manner beneficially allows the sharing of one or more input pins or terminals of a test circuit among two or more test core circuits 300. For instance, a single input terminal of the test circuit 242 may be used provide data to two or more cores that are connected in a hierarchical manner. By sharing the input pins or terminals, the total number of pins in the IC may be reduced or the remaining pins may be reserved for implementing other functions.

To allow a core to be connected in a variety of hierarchical configurations, the core may include pseudo-inputs and pseudo-outputs. These pseudo-inputs and outputs are interface ports that are accessible within the test circuit 242, but are inaccessible from outside the test circuit 242. During a design stage of the IC, pseudo-inputs and pseudo-outputs of two or more core circuits 300 inside the same test circuit 242 may be connected to implement a hierarchical structure. The hierarchical structure of the core circuits 300 enables transmission of duplicative data and facilitates more efficient use of the pins and resources available on the IC.

Figure 4:
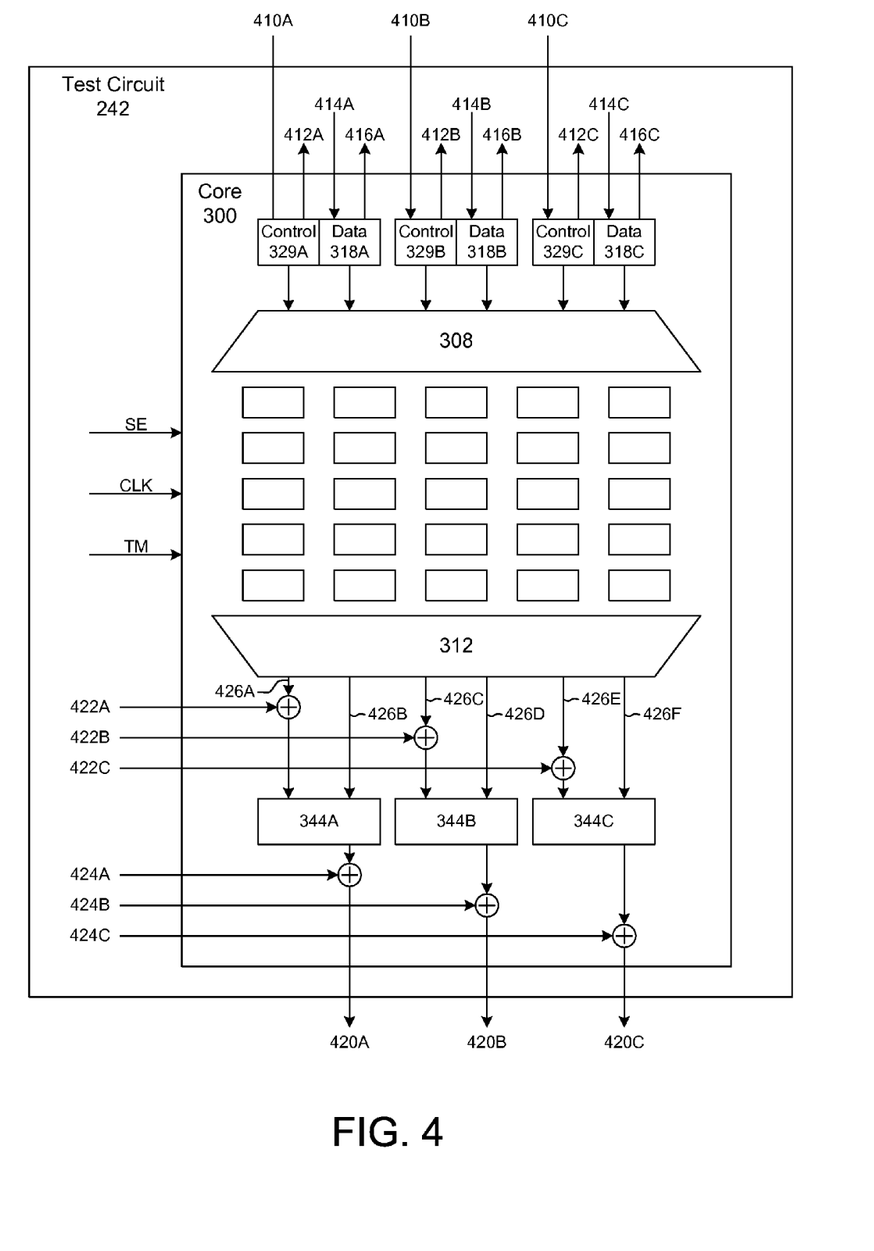
FIG. 4 is a diagram illustrating a test core circuit for connecting in a hierarchical manner, according to one embodiment.

FIG. 4 illustrates a test core circuit 300 of a test circuit 242 that can be connected to other test core circuits 300 in a hierarchical manner, according to one embodiment. To allow for the hierarchical connections described below with reference to FIGS. 5A through 5F, the test core circuit 300 may include, among other interface ports, pseudo-input ports 414A, 414B, 414C, 422A, 422B, 422C, 424A, 424B, and 424C, and pseudo-output ports 412A, 412B, 412C, 416A, 416B, and 416C (hereinafter collectively referred to as "pseudo-output ports 412"). Test core circuit 300 may also include real input ports 410A, 410B, and 410C (hereinafter collectively referred to as "real input ports 410"), and real output ports 420A, 420B, and 420C (hereinafter collectively referred to as "real output ports 420"). The test core circuit 300 and test circuit 242 of FIG. 4 are shown as having three real input ports 410A through 410C (hereinafter collectively referred to as "real input ports 410") and three real output ports 420A through 420C (hereinafter collectively referred to as "real input ports 420"). However, the test core circuit 300 and test circuit 242 of FIG. 4 may have a different number of real input ports 410 and output ports 420 (e.g., one real input port and two real output ports). The number of real input ports 410 may be specified by a designer of the test circuit or set by a tool used to generate the test circuit (e.g., a test circuit compiler).

Pseudo-input ports 414A, 414B, and 414C are configured to receive scan-in data to be stored in scan-in data registers 318A, 318B, and 318C, respectively. Pseudo-input ports 422A, 422B, and 422C are configured to receive scan-out data to be combined with the inputs of scan-out registers 344A, 344B, and 344C, respectively. One or more of the pseudo-input ports 422A, 422B, and 422C can be coupled to ground to provide appropriate outputs to the scan-out registers 422A, 422B, and 422C. Pseudo-input ports 424A, 424B, and 424C are configured to receive scan-out data from the current core circuit 300 or from another core circuit in the same test circuit 242 for combining with the outputs of scan-out registers 344A, 344B, and 344C, respectively.

Pseudo-output ports 412A, 412B, and 412C carries output control data and/or scan-in from control registers 329A, 329B, and 329C. Pseudo-output ports 416A, 416B, and 416C are configured to output scan-in data from scan-in data registers 318A, 318B, and 318C.

Pseudo-input ports 414A, 414B, 414C, 422A, 422B, 422C, 424A, 424B, and 424C may be connected to other nets inside the test circuit 242. For instance, pseudo-input port 414 may be connected to one of pseudo-output ports 412A through 412C and/or one of pseudo-output ports 414A through 414C. Pseudo-input ports 414A, 414B, 414C, 422A, 422B, 422C, 424A, 424B, and 424C are not directly connected to components outside of the test circuit 242 to receive data. For instance, pseudo-input ports 414A, 414B, 414C, 422A, 422B, 422C, 424A, 424B, and 424C may not be directly connected to a sub-circuit 210, 212. Pseudo-input ports 414A, 414B, 414C, 422A, 422B, 422C, 424A, 424B, and 424C and pseudo-output ports 412A, 412B, 412B, 422A, 422B, 422C, 424A, 424B, and 424C are included in a test core circuit 300 to allow the test core circuit 300 to be connected in one of various hierarchical structures, described below with respect to FIGS. 5A through 5F.

Real input ports 410A, 410B, and 410C may be connected to components inside the test circuit 242, as well as components outside of the test circuit 242. For instance, real input port 410A may be connected to an input pin of the test circuit 242 or a multiplexer of the test circuit 242. In another example, real input port 410B may be connected to control data pseudo-output port 412A of test core circuit 300, or a pseudo-output port 412A of another test circuit core. Real output ports 420A, 420B, and 420C may also be connected to components inside the test circuit 242, as well as components outside of the test circuit 242. For instance, real output port 420A may be connected to an output pin of test circuit 242, or a multiplexer of test circuit 242. In another example, real output port 420A may be connected to pseudo-input port 422B of test core circuit 300, or a pseudo-input port of another test core circuit.

By using the test core circuit 300 of FIG. 4, a test circuit including multiple test core circuit arranged in various types of hierarchical architecture can be designed and implemented conveniently. Such hierarchical architecture using test core circuit 300 of FIG. 4 allows designers of ICs to use inputs of the test circuit 242 more efficiently. For instance, using the pseudo-input ports and pseudo-output ports of two or more test core circuits 300, a single input port of the test circuit 242 may be used to supply control data and scan-in data to the two or more test core circuits 300.

Connecting two or more test core circuits 300 in a hierarchical manner may increase the complexity in providing control data and/or scan-in data to the test core circuits 300. For instance, a designer of a test circuit 242 may want to prevent control data from reaching scan-in data registers 318. Additionally, connecting two or more test core circuits 300 may add complexity in the routing of the wires connecting the various inputs and outputs of each test core circuit 300.

To address these issues, the test core circuit of FIG. 4 may include multiple control data registers 329A, 329B, and 329C, multiple scan-in data registers 318A, 318B, and 318C, and multiple scan-out registers 344A, 344B, and 344C. Having multiple control data registers, scan-in data registers, and/or scan-out data registers in a test core circuit 300 beneficially allows designers to connect the registers in one of various hierarchical structures such as the ones described with respect to FIGS. 5A through 5F to route control data and scan-in data to their corresponding registers.

Control pseudo-output ports 412, scan-in data pseudo-input ports 414, and scan-in data pseudo-output ports 416 are used to connect the input of test core circuits 300 in one of the input configurations described below with reference to FIGS. 5A through 5F. Test core circuit 300 of FIG. 4 beneficially allows designers to use the same design of the test core circuit 300 to be connected in various hierarchical configurations, without having to modify the design of the test core circuit 300 itself. Hence, the designer of the test circuit 242 can more flexibly design the desired test circuit 242.

Figure 5A:
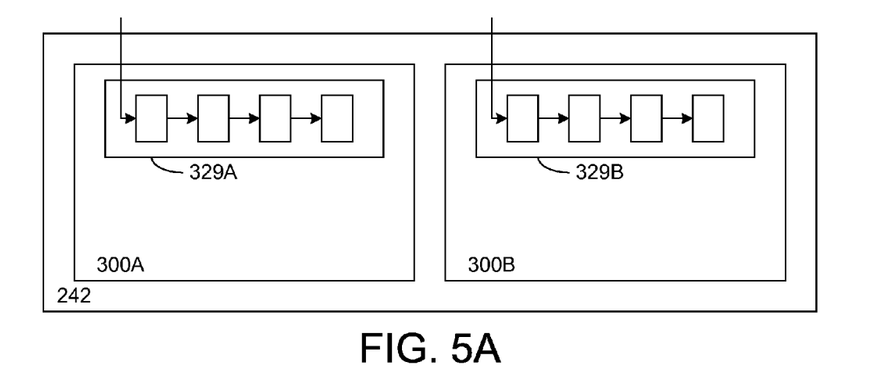
FIG. 5A is a diagram illustrating two test core circuits in a dedicated input configuration, according to one embodiment.

One example of the test circuit design is illustrated in FIG. 5A. FIG. 5A is a diagram illustrating a dedicated input configuration, according to one embodiment. Each of the test core circuits 300A, 300B has an independent input terminal that can receive control data and scan-in data from outside the test circuit 242. In the embodiment of FIG. 5A, the first control pseudo-output port 412A is connected to the first scan-in data pseudo-input port 414A, the second control pseudo-output port 412B is connected to the second scan-in data pseudo-input port 414B, and the third control pseudo-output port 412C is connected to the third scan-in data pseudo-input port 414C.

Figure 5B:
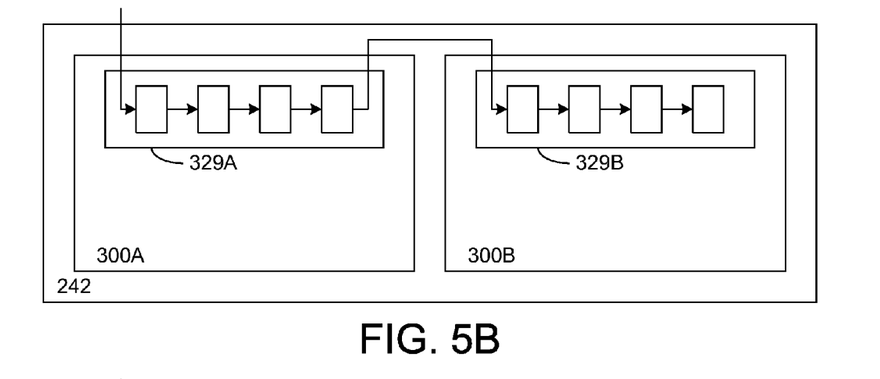
FIG. 5B is a diagram illustrating two test core circuits in a serial input configuration, according to one embodiment.

FIG. 5B is a diagram illustrating a serial input configuration with one input port, according to one embodiment. In a serial input configuration, as illustrated in FIG. 5B, one input terminal of the test circuit 242 is used to provide control data and/or scan-in data to multiple test core circuits 300. Control data and/or scan-in data is provided to a first test core circuit 300A, the control data and/or scan-in data is shifted through the registers of the first test core circuit 300A, and when the control data and/or scan-in data is shifted out of the registers of the first test core circuit 300A, the control data and/or scan-in data is provided to the second test core circuit 300B. In a serial input configuration, the first control pseudo-output port 412A may be connected to the second control real input port 410B, and the second control pseudo-output port 412B may be connected to the third control real input port 410C. The third control pseudo-output port 412C may be connected the first scan-in data pseudo-input port 414A, the first scan-in data pseudo-output port 416A may be connected to the second scan-in data pseudo-input port 414B, and the second scan-in data pseudo-output port 416C may be connected to the third scan-in data pseudo-input port 414C.

When a serial input configuration is used, it may be beneficial to keep the order of certain input types. For instance, it may be beneficial to keep the order between control data and scan-in data. The values stored in the scan-in registers 318 are fed to the scan chains of test circuit 242. If a control data value is shifted to a scan-in data register 318, the control data value would be fed into the scan chains of test circuit 242, which causes an error during the testing operation. Thus, to prevent control data from entering the scan chains of test circuit 242, the input shift registers of the first test core circuit 300A and the input shift registers of the second test core circuit 300B may be connected as shown in FIG. 6A.

Figure 6A:
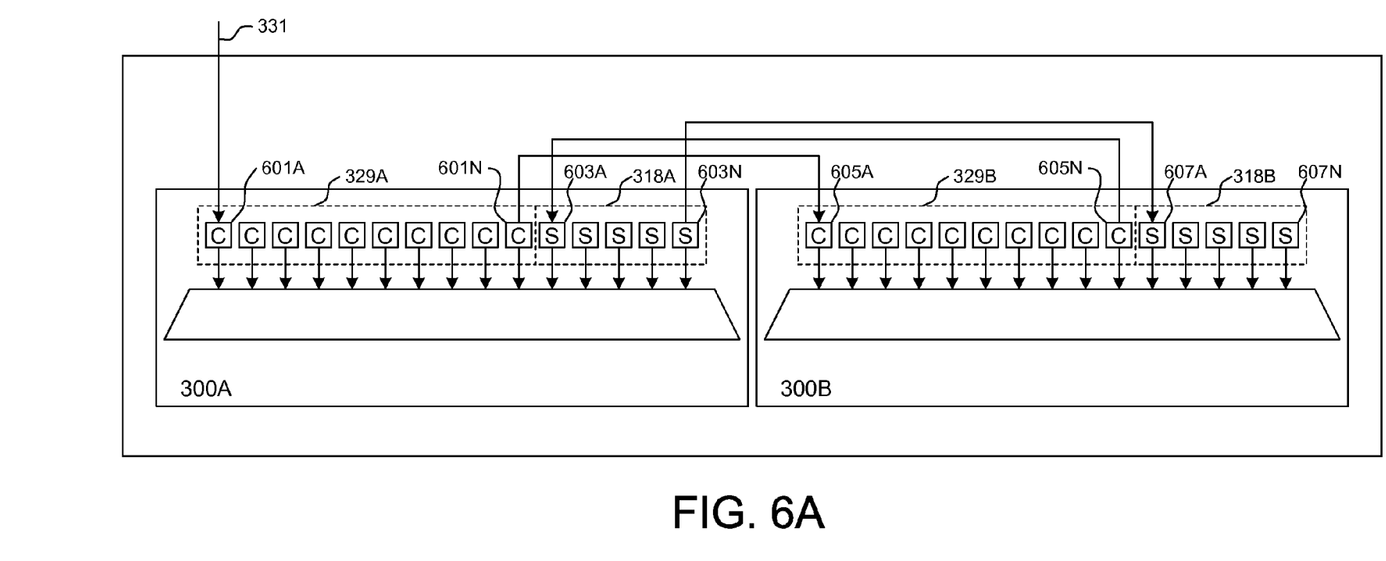
FIG. 6A is a diagram illustrating shift register connections across cores, according to one embodiment.

FIG. 6A illustrates the connection between the input scan registers of a first test core circuit 300A and the input scan registers of a second test core circuit 300B in a serial input configuration, according to one embodiment. Scan-in data and control data are received via line 331. The scan-in data and/or control data are received by the first control data register 601A of the first test core circuit 300A. The data is then shifted to the right direction of FIG. 6A to other control data registers 601 of the first test core circuit 300A as further data bits are received via the line 331.

When the data reaches the last control data register 601N of the first test core circuit 300A, instead of shifting the data to the first scan-in data register 603A of the first test core circuit 300A, the data is shifted to the first control data register 605A of the second test core circuit 300B. Data is shifted to other control data registers 605 of the second test core circuit 300B. When the data reaches the last control data register 605N, the data is shifted to the first scan-in data register 603A of the first test core circuit 300A. The data is then shifted to other scan-in data registers 603 of the first test core circuit 300A until it reaches the last scan-in data register 603N of the first test core circuit 300A. After the data reaches scan-in data register 603N, the data is shifted to the first scan-in data register 607A of the second test core circuit 300B. The data is then shifted to other scan-in data registers 607 until it reaches the last scan-in data register 607N of the second test core circuit 300B.

Figure 5C:
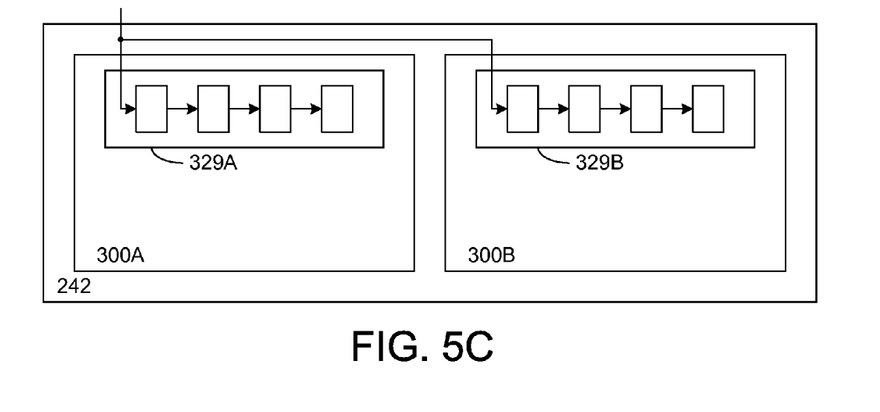
FIG. 5C is a diagram illustrating two test core circuits in a fan in configuration, according to one embodiment.

FIG. 5C is a diagram illustrating a fan-in configuration with one input port, according to one embodiment. In the fan-in configuration, as illustrated in FIG. 5C, an input terminal of the test circuit 242 is shared between two or more test core circuits 300. Control data and/or scan-in data provided via an input terminal of the test circuit 242 is fed to the input of the first test core circuit 300A and the input of the second test core circuit 300B in parallel. In a fan-in configuration, the first control pseudo-output port 412A is connected to the first scan-in data pseudo-input port 414A, the second control pseudo-output port 412B is connected to the second scan-in data pseudo-input port 414B, and the third control pseudo-output port 412C is connected to the third scan-in pseudo-input port 414C. The control real input ports 410A, 410B and 410C are then connected to each other such input data is fed to the three control registers 329A, 329B, 329C in parallel.

Figure 5D:
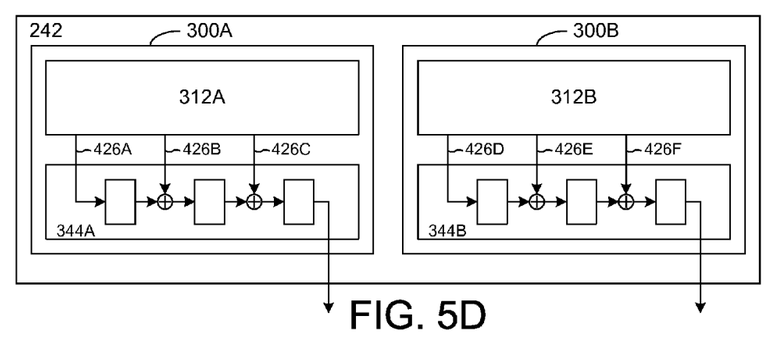
FIG. 5D is a diagram illustrating two test core circuits in a dedicated output configuration, according to one embodiment.

Scan-out pseudo-input ports are used to connect the output of the test core circuits 300 in one of the output configurations described herein. For instance, to connect test core circuit 300 in a dedicated output configuration with three independent output ports. In a dedicated output configuration, scan-out input ports 422 and 424 of the test core circuits 300A and 300B are connected to logic 0 or ground, resulting in the circuit as illustrated in FIG. 5D. Each of test core circuits 300A, 300B has a separate output terminal for providing scan-out data to components outside of the test circuit 242.

Figure 5E:
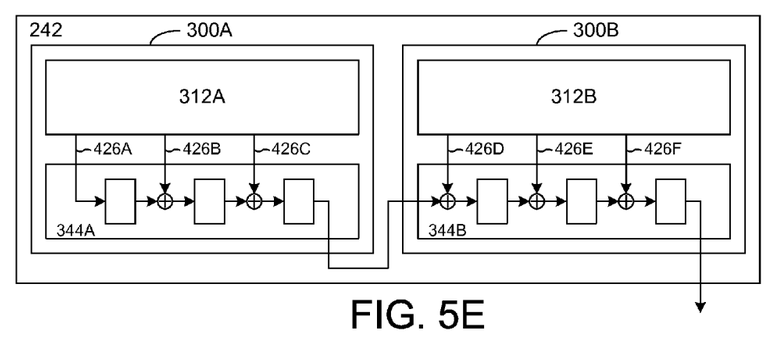
FIG. 5E is a diagram illustrating two test core circuits in a serial output configuration, according to one embodiment.

FIG. 5E is a diagram illustrating arrangement of test core circuits 300A, 300B in a serial output configuration sharing one output port, according to one embodiment. In the serial output configuration of FIG. 5E, one output terminal of the test circuit 242 is shared between two or more test core circuits 300. The output of the last register of the output registers 344 of the first test core circuit 300A is combined with the input 426D of the first register of the output registers 344 of the second test core circuit 300B. In the embodiment of FIG. 5E, the output of the last register of the output registers 344A of the first test core circuit 300A is combined with the input of the first register of the output registers 344B of the second test core circuit 300B using an XOR operator. In a serial output configuration, first scan-out output port 420A may be connected to second scan-out pseudo-input 422B, and second scan-out output may be connected to third scan-out pseudo-input port 422C. Other scan-out pseudo-inputs 422A, 424A, 424B and 424C are connected to logic 0 or ground.

Figure 5F:
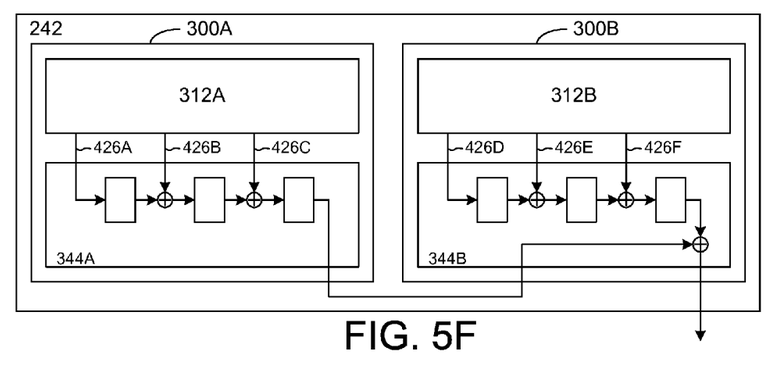
FIG. 5F is a diagram illustrating two test core circuits in a fan out configuration, according to one embodiment.

FIG. 5F is a diagram illustrating arrangement of test core circuits 300A, 300B in a fan-out configuration with one output port, according to one embodiment. In a fan-out configuration, as illustrated in FIG. 5F, an output terminal of the test circuit 242 is shared between two or more test core circuits 300. The output of the first test core circuit 300A is combined with the output of the second test core circuit 300B using an XOR operator. In a fan-out configuration, scan-out output port 420A is connected to scan-out pseudo-input port 424B, and scan-out output port 420B is connected to scan-out pseudo-input port 424C. Other scan-out pseudo-input ports 422A, 422B, 422C, and 424A are connected to logic 0 or ground.

In some embodiments, test core circuit 300 may include additional pseudo-inputs and pseudo-outputs. For instance, test core circuit 300 may include pseudo-outputs and pseudo-inputs for each type of control data types (e.g., input mode control data, direction control data, mask control data, etc.). While including additional pseudo-input and/or pseudo-output ports increases the flexibility of a test core circuit 300, the additional pseudo-input ports and pseudo-output ports increase the complexity and congestion of the metal interconnects in the design of the test core circuit 300.

The registers of test core circuits may also be connected in a combination of configurations as described above with reference to FIGS. 5A through 5F. For instance, a first subset of registers may be connected in a serial input configuration, while a second subset of registers may be connected in a fan-in configuration.

Figure 6B:
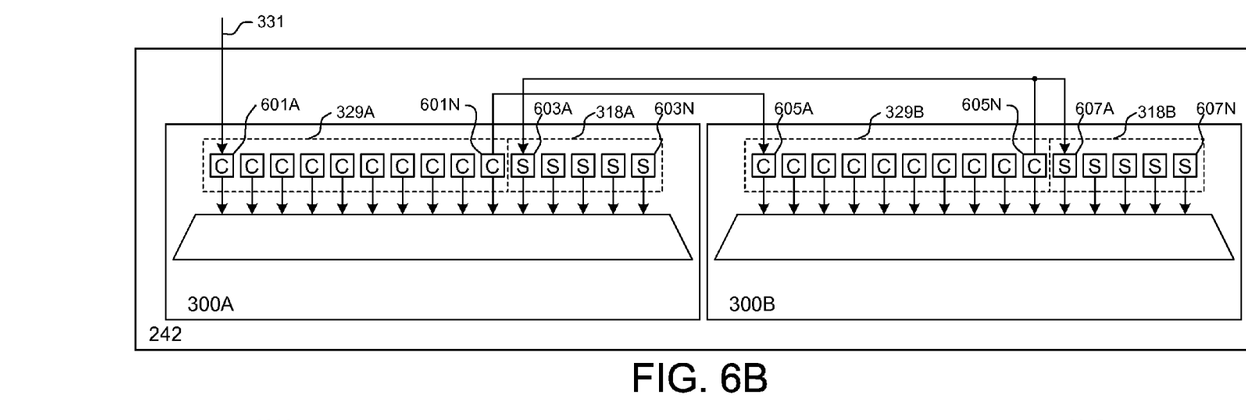
FIG. 6B illustrates the connection between the input scan registers of a first test core circuit and the input scan registers of a second test core circuit, according to one embodiment.

FIG. 6B illustrates the connection between the input scan registers of a first test core circuit 300A and the input scan registers of a second test core circuit 300B, according to one embodiment. In this embodiment, the control data registers 329 are connected in a serial configuration and the scan-in data registers 318 are connected in a fan-in configuration. Scan-in data and control data is received via line 331. The scan-in data and/or control data is received by the first control data register 601A of the first test core circuit 300A. The data is then shifted to other control data registers 601 of the first test core circuit 300A. When the data reaches the last control data register 601N of the first test core circuit 300A, the data is shifted to the first control data register 605A of the second test core circuit 300B. Data is shifted to other control data registers 605 of the second test core circuit 300B. When the data reaches the last control data register 605N, the data is shifted to both the first scan-in data register 603A of the first test core circuit 300A and the first scan-in data register 607A of the second test core circuit 300B in parallel. The data is then shifted to other scan-in data registers 603, 607 until the data reaches the last scan-in data register 603N of the first test core circuit 300A, and the scan-in data register 607N of the second test core circuit 300B.

Figure 6C:
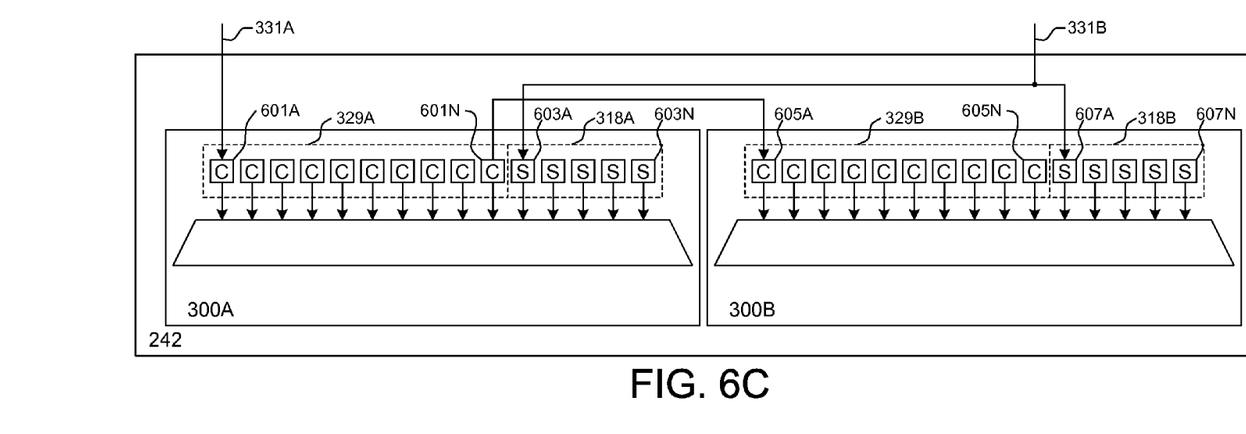
FIG. 6C illustrates the connection between the input scan registers of a first test core circuit and the input scan registers of a second test core circuit, according to one embodiment.

FIG. 6C illustrates the connection between the input scan registers of a first test core circuit 300A and the input scan registers of a second test core circuit 300B, according to one embodiment. In this embodiment, the control data registers 329 are connected in a serial configuration and the scan-in data registers 318 are connected in a fan-in configuration. Further, control data registers 329 and scan-in data registers 318 have dedicated inputs. Control data is received via line 331A. The control data is received by the first control data register 601A of the first test core circuit 300A. The control data is then shifted to other control data registers 601 of the first test core circuit 300A. When the control data reaches the last control data register 601N of the first test core circuit 300A, control data is shifted to the first control data register 605A of the second test core circuit 300B. Control data is shifted to other control data registers 605 of the second test core circuit 300B until control data reaches the last control data register 605N of the second test core circuit 300B. Scan-in data is received via line 331B. Scan-in data is received in parallel by both, the first scan-in data register 603A of the first test core circuit 300A and the first scan-in data register 607A of the second test core circuit 300B in parallel. Scan-in data is then shifted to other scan-in data registers 603, 607 until scan-in data reaches the last scan-in data register 603N of the first test core circuit 300A, and the scan-in data register 607N of the second test core circuit 300B.

Test circuits using test core circuits described herein may be designed using a test circuit design tool, such as a test circuit compiler. A user of the test circuit design tool may specify parameters describing one or more test core circuits 300 and may describe how the test core circuits 300 are to be connected to each other. For instance, a user may specify a test circuit 242 that includes a first and second test core circuits 300 connected using a serial input and serial output configuration, and a third test core circuit 300 connected to the first and second test core circuits 300 using a fan-in and fan-out configuration. The test circuit design tool then generates a computer file (e.g., a net list, and hardware description language (HDL) file, a graphic database system (GDS) file, etc.) that includes a design of a test circuit with the arrangement of test core circuits as specified by the user.

As such, it would be beneficial for the test circuit design tool to use a test core circuit 200 that has the flexibility of being connected to other test core circuits 300 in any of the above described configurations.

Figure 7:
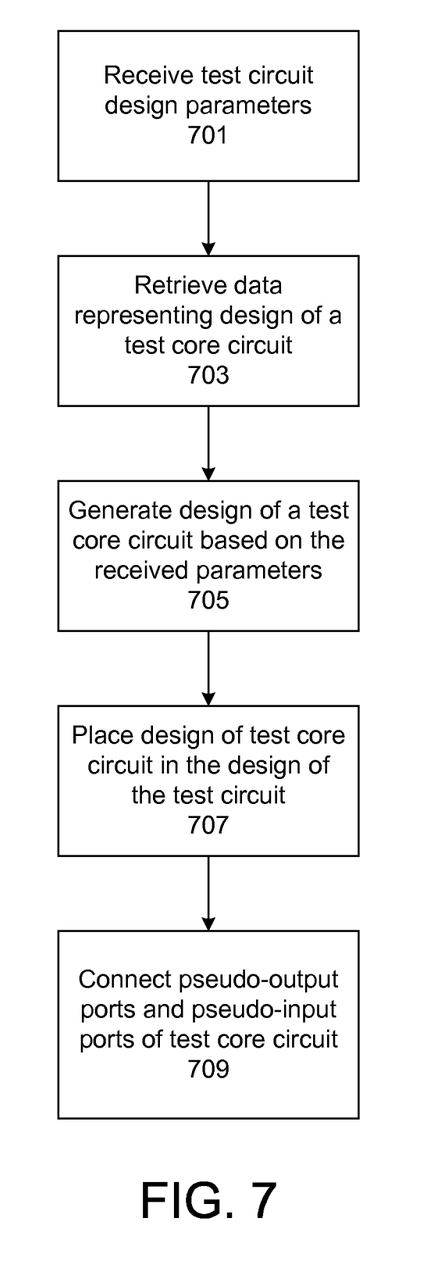
FIG. 7 illustrates a flow diagram of a method for generating a test circuit, according to one embodiment.

FIG. 7 illustrates a flow diagram of a method for generating a design of a test circuit with multiple core circuits arranged in a hierarchical manner, according to one embodiment. First, one or more test circuit design parameters are received 701. The one or more parameters may include the number of test cores to be included in the test circuit, characteristics of the test cores (e.g., length of a scan chain of a test core, the compression and/or decompression scheme of a test core, etc.), the connections between the components of the test circuit 242 (e.g., connections between two or more test core circuits 300), etc.

Data representing a design of a test core circuit is retrieved 703. For example, the data representing the design of the test core circuit may be retrieved from a memory of the computer used to generate the design of the test circuit 242.

The design of a test core circuit 300 is generated 705 based at least on some of the received parameters and the retrieved data representing the design of the test core circuit. The design of the test core circuit 300 is generated with multiple pseudo-inputs and pseudo-outputs. For instance, the design of the test core circuit 300 may include control pseudo-output ports 412, scan-in data pseudo-input ports 414, scan-in data pseudo-output ports 416, and scan-out pseudo-output ports 422, 424.

The generated design of the test core circuit 300 is placed 707 in the design of the test circuit 242. Other test core circuits 300 may also be generated and paced in the test circuit 242 to be connected using a hierarchical configuration, such as the ones described with respect to FIGS. 5A through 5F.

The design of the test circuit is then updated to connect 709 pseudo-output ports and pseudo-input ports of the test core circuit 300 in the test circuit 242. For instance, two test cores circuit may be connected in a dedicated input configuration, serial input configuration, or fan-in configuration based on the design parameters. Additionally, the two test core circuits may be connected in a dedicated output configuration, serial output configuration, or fan-out configuration.

In some embodiments, the design of the test circuit 242 is generated as a netlist, an HDL file, a GDS file, or the like. The design of the test circuit 242 may include, among other components, one or more input ports and one or more output ports for interfacing with the components of the test circuit. A designer of an integrated circuit may connect other components of the integrated circuit to the input ports and output ports of the test circuit. Since the pseudo-input ports and pseudo-output ports of the test core circuits are not accessible from outside the test circuit 242, the designer of the integrated circuit may not connect other components of the integrated circuit to the pseudo-inputs and/or pseudo-outputs of the test core circuits 300.

Figure 8:
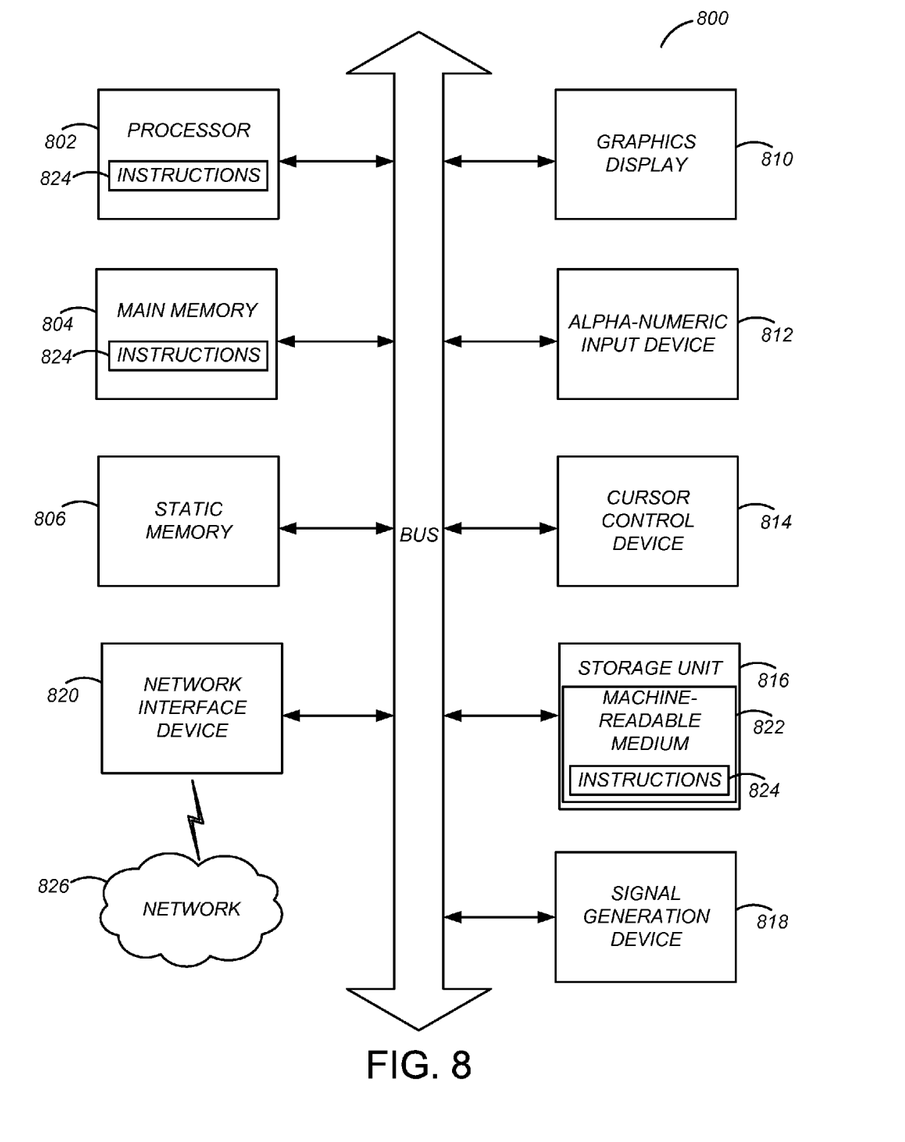
FIG. 8 illustrates a block diagram illustrating components of an example machine able to read instructions from a machine-readable medium and execute them in a processor, according to one embodiment.

FIG. 8 is a block diagram illustrating components of an example machine able to read instructions from a machine-readable medium and execute them in a processor (or controller). Specifically, FIG. 8 shows a diagrammatic representation of a machine in the example form of a computer system 800 within which instructions 824 (e.g., software) for causing the machine to perform any one or more of the methodologies discussed herein may be executed. The computer system 800 may be used to perform operations associated with designing a test circuit including a plurality of test core circuits arranged in a hierarchical manner.

The example computer system 800 includes a processor 802 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 804, and a static memory 806, which are configured to communicate with each other via a bus 808. The computer system 800 may further include graphics display unit 810 (e.g., a plasma display panel (PDP), a liquid crystal display (LCD), a projector, or a cathode ray tube (CRT)). The computer system 800 may also include alphanumeric input device 812 (e.g., a keyboard), a cursor control device 814 (e.g., a mouse, a trackball, a joystick, a motion sensor, or other pointing instrument), a storage unit 816, a signal generation device 818 (e.g., a speaker), and a network interface device 820, which also are configured to communicate via the bus 808.

The storage unit 816 includes a machine-readable medium 822 on which is stored instructions 824 (e.g., software) embodying any one or more of the methodologies or functions described herein. The instructions 824 (e.g., software) may also reside, completely or at least partially, within the main memory 804 or within the processor 802 (e.g., within a processor's cache memory) during execution thereof by the computer system 800, the main memory 804 and the processor 802 also constituting machine-readable media. The instructions 824 (e.g., software) may be transmitted or received over a network 826 via the network interface device 820.

While machine-readable medium 822 is shown in an example embodiment to be a single medium, the term "machine-readable medium" should be taken to include a single medium or multiple media (e.g., a centralized or distributed database, or associated caches and servers) able to store instructions (e.g., instructions 824). The term "machine-readable medium" shall also be taken to include any medium that is capable of storing instructions (e.g., instructions 824) for execution by the machine and that cause the machine to perform any one or more of the methodologies disclosed herein. The term "machine-readable medium" includes, but not be limited to, data repositories in the form of solid-state memories, optical media, and magnetic media. The design of the test circuit including multiple test core circuits may be stored in the machine-readable medium 822.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations may be made in the arrangement, operation and details of the method and apparatus disclosed herein without departing from the spirit and scope of this disclosure.

What is claimed is:

1. A core circuit in a test circuit comprising:
at least one real input configured to receive scan-in data and control data for controlling operation of the core circuit from a source external to the test circuit;

an input register chain coupled to the at least one real input and configured to store the scan-in data and the control data;

at least one scan chain coupled to a subset of registers in the register chain to receive the scan-in data and configured to generate a scan-out data representing presence of faults in an associated circuit responsive to receiving the scan-in data;

a pseudo-output coupled to the input register chain and configured to send at least a subset of the scan-in data and the control data to another input register chain in the core circuit or to another core circuit; and a pseudo-input coupled to the input register chain, the pseudo input coupled directly to a pseudo output of the core circuit or the other core circuit.

2. The core circuit of claim 1, further wherein the pseudo-input is coupled to a portion of the input register chain for storing a subset of the scan-in data.

3. The core circuit of claim 1, wherein the pseudo-output is coupled to a portion of the input register chain for storing a subset of the scan-in data.

4. The core circuit of claim 3, wherein:
the pseudo-output of the core circuit is coupled to a real input of the other core circuit, the pseudo-input of the core circuit coupled to a pseudo-input of the other core circuit.

5. The core circuit of claim 3, wherein the at least one real input of the core circuit is coupled to a real input of another core circuit.

6. The core circuit of claim 5, wherein:
the pseudo-output of the core circuit is coupled to the data pseudo-input of the core circuit, and
a pseudo-output of the other core circuit is coupled to a pseudo-input of the other core circuit.

7. The core circuit of claim 1, wherein the pseudo-output of the core circuit is coupled to a portion of the input register chain for string a subset of the control data.

8. The core circuit of claim 7, wherein the pseudo-output of the core circuit is coupled to a pseudo-input of the other core circuit.

9. The core circuit of claim 7, wherein a pseudo-output of the other core circuit is coupled to a pseudo-input of the other core circuit.

10. The core circuit of claim 1, further comprising:
a compressor coupled to the at least one scan chain to compress the scan-out data; and
at least one first scan-out pseudo input coupled to an output of the compressor and configured to receive data from an output register of the core circuit or another core circuit, the at least one first scan-out pseudo-input to be combined with an output of the compressor.

11. The core circuit of claim 10, wherein the at least first scan-out pseudo-input is combined with the output of the compressor by an XOR operator.

12. The core circuit of claim 10, further comprising:
an output register coupled to the compressor and configured to store compressed data derived from the scan-out data and an input signal received via the first pseudo input; and
at least a second scan-out pseudo input coupled to the output register and configure to receive data from another output register of the core circuit or another core circuit, the at least one second scan-out pseudo-input to be combined with an output of the output register.

13. The core circuit of claim 12, wherein the at least one second scan-out pseudo-input is combined with the output of the output register by an XOR operation.

14. The core circuit of claim 10, wherein:
the output of the output register of the core circuit is coupled to a first scan-out pseudo-input of another core circuit; and
the at least one first scan-out pseudo-input of the core circuit is coupled to ground.

15. The core circuit of claim 10, further comprising:
the output of the output register of the core circuit is coupled to a second scan-out pseudo-input of another core circuit; and
the at least second scan-out pseudo-input of the core circuit is coupled to ground.

16. A non-transitory computer-readable medium storing a design of a core circuit for including in a test circuit, the design of the core circuit comprising:
at least one real input configured to receive scan-in data and control data for controlling operation of the core circuit from a source external to the test circuit;

an input register chain coupled to the at least one real input and configured to store the scan-in data and the control data;

at least one scan chain coupled to a subset of registers in the register chain to receive the scan-in data and configured to generate a scan-out data representing presence of faults in an associated circuit responsive to receiving the scan-in data;

a pseudo-output coupled to the input register chain and configured to send at least a subset of the scan-in data and the control data to another input register chain in the core circuit or to another core circuit; and a pseudo-input coupled to the input register chain, the pseudo input coupled directly to a pseudo output of the core circuit or the other core circuit.

17. The non-transitory computer-readable medium of claim 16, wherein the pseudo-input is coupled to a portion of the input register chain for storing a subset of the scan-in data.

18. The non-transitory computer-readable medium of claim 16, wherein the pseudo-output is coupled to a portion of the input register chain for storing a subset of the scan-in data.

19. A non-transitory computer-readable medium storing instructions for generating a design of a test circuit, the instructions when executed by a processor cause the processor to:
receive one or more parameters for generating a design of a test circuit, the one or more parameters including a description of one or more test core circuits;

generate a core circuit based on the received one or more parameters, the test core circuit including:
at least one real input configured to receive scan-in data and control data for controlling operation of the core circuit from a source external to the test circuit;

an input register chain coupled to the at least one real input and configured to store the scan-in data and the control data;

at least one scan chain coupled to a subset of registers in the register chain to receive the scan-in data and configured to generate a scan-out data representing presence of faults in an associated circuit responsive to receiving the scan-in data;

a pseudo-output coupled to the input register chain and configured to send at least a subset of the scan-in data and the control data to another input register chain in the core circuit or to another core circuit; and a pseudo-input coupled to the input register chain, the pseudo input coupled directly to a pseudo output of the core circuit or the other core circuit; and generate connections for at least one of the pseudo-outputs and at least one of the pseudo-inputs based on the received one or more parameters.

* * * * *